United States Patent
Palm (10) Patent No.: US 9,431,282 B2
(45) Date of Patent: Aug. 30, 2016

(54) WAFER INVERSION MECHANISM

(71) Applicant: Rudolph Technologies, Inc., Flanders, NJ (US)

(72) Inventor: Troy Palm, Eden Prairie, MN (US)

(73) Assignee: Rudolph Technologies, Inc., Wilmington, MA (US)

(*) Notice: Subject to any disclaimer, the term of this patent is extended or adjusted under 35 U.S.C. 154(b) by 196 days.

(21) Appl. No.: 13/723,618

(22) Filed: Dec. 21, 2012

(65) Prior Publication Data

US 2013/0209211 A1   Aug. 15, 2013

Related U.S. Application Data

(60) Provisional application No. 61/580,641, filed on Dec. 27, 2011.

(51) Int. Cl.
- *H01L 21/68* (2006.01)
- *B25J 15/00* (2006.01)
- *H01L 21/677* (2006.01)
- *H01L 21/687* (2006.01)

(52) U.S. Cl.
CPC ............... *H01L 21/68* (2013.01); *B25J 15/00* (2013.01); *H01L 21/67775* (2013.01); *H01L 21/68707* (2013.01)

(58) Field of Classification Search
CPC ............ B65G 57/08; H01L 21/67721; H01L 21/683; H01L 21/68721; H01L 21/68728
USPC ....... 414/783, 754, 758, 761, 763, 771, 781, 414/784, 816, 935, 941; 901/31, 39; 294/87.26, 119.1, 213
See application file for complete search history.

(56) References Cited

U.S. PATENT DOCUMENTS

| | | | | |
|---|---|---|---|---|
| 4,448,405 A | * | 5/1984 | Cipolla | 269/32 |
| 4,915,564 A | * | 4/1990 | Eror et al. | 414/217 |
| 5,105,147 A | * | 4/1992 | Karasikov et al. | 324/537 |
| 5,954,072 A | * | 9/1999 | Matusita | 134/149 |
| 6,540,468 B1 | * | 4/2003 | Blattner | H01L 21/67763 414/416.08 |
| 6,592,324 B2 | * | 7/2003 | Downs | B25J 15/0253 294/104 |
| 6,635,516 B1 | * | 10/2003 | Komatsu | 438/143 |
| 6,692,219 B2 | * | 2/2004 | Coomer | H01L 21/68707 294/188 |
| 6,767,846 B2 | * | 7/2004 | Kopacz et al. | 438/758 |
| 7,100,954 B2 | * | 9/2006 | Klein et al. | 294/64.3 |
| 7,187,994 B1 | * | 3/2007 | Ashkenaz et al. | 700/121 |
| 7,290,978 B2 | * | 11/2007 | Tran | 414/763 |
| 7,400,392 B2 | * | 7/2008 | Tillmann | 356/237.4 |
| 7,661,921 B2 | * | 2/2010 | Kim et al. | 414/744.5 |
| 7,926,441 B2 | * | 4/2011 | Tsutsumi | H01L 21/67051 118/300 |
| 2002/0157692 A1 | * | 10/2002 | Ishihara et al. | 134/134 |
| 2004/0071534 A1 | * | 4/2004 | Raymond | 414/416.01 |
| 2005/0110288 A1 | * | 5/2005 | Kern, Jr. | 294/2 |
| 2006/0035563 A1 | * | 2/2006 | Kalenian et al. | 451/5 |
| 2006/0045722 A1 | * | 3/2006 | Hashimoto | 414/754 |
| 2006/0120833 A1 | * | 6/2006 | Bonora et al. | 414/217 |
| 2008/0131239 A1 | * | 6/2008 | Rebstock | B25J 15/0052 414/225.01 |
| 2008/0152466 A1 | * | 6/2008 | Bonora | B65G 1/0407 414/222.07 |
| 2008/0199284 A1 | * | 8/2008 | Mitsuyoshi et al. | 414/223.02 |
| 2008/0267747 A1 | * | 10/2008 | DiBella et al. | 414/225.01 |
| 2009/0067959 A1 | * | 3/2009 | Takahashi et al. | 414/226.01 |
| 2009/0232631 A1 | * | 9/2009 | Zenpo et al. | 414/751.1 |
| 2010/0215473 A1 | * | 8/2010 | Pedersen | B65G 47/90 414/800 |

* cited by examiner

*Primary Examiner* — Michael McCullough
*Assistant Examiner* — Lynn Schwenning
(74) *Attorney, Agent, or Firm* — Dicke, Billig & Czaja, PLLC (57) ABSTRACT

A BOLTS compatible module includes a support mechanism for gripping a wafer. The support mechanism is coupled to a rotary mechanism for rotating the support mechanism with a wafer grip therein. The rotary mechanism is coupled to the module and capable of at least 180° of rotation.

17 Claims, 6 Drawing Sheets

WAFER INVERSION MECHANISM

CROSS-REFERENCE TO RELATED APPLICATION

This application claims priority under 35 U.S.C. §119(e) to U.S. Provisional Patent Application Ser. No. 61/580,641 filed on Dec. 27, 2011, and incorporated herein by reference.

TECHNICAL FIELD

The present disclosure relates generally to a mechanism for inverting or queuing a semiconductor substrate for processing or inspection. The mechanism has a BOLTS (Box Opener/Loader to Tool Standard) compatible form which allows it to be used with SEMI standard handling systems as issued by the global industry association SEMI of San Jose, Calif.

BACKGROUND

Inspection or processing of the backside (non-active side) of semiconductor substrates such as wafers typically relies upon specialized systems that can be directed to the backside of the substrate. Such systems, while useful, are costly in terms of their limited utility. Accordingly it is desirable to invert a substrate so that a standard front side system to inspect a substrate's backside or to perform some sort of process thereon.

SUMMARY

A BOLTS compatible module includes a support mechanism for gripping a wafer. The support mechanism is coupled to a rotary mechanism for rotating the support mechanism with a wafer gripped therein. The rotary mechanism is coupled to the module and capable of at least 180° of rotation.

In another aspect, an edge grip mechanism includes at least two gripping members. Each gripping member includes a first portion and a second portion that reciprocate between an open position in which a substrate may be placed or removed and a closed position in which the substrate is positively grasped. Each gripping member has a pair of contact faces that work in conjunction with one another to grasp a substrate.

In yet a further aspect, a method of handling a substrate is disclosed. The method includes positioning the substrate between two gripping members and rotating the substrate 180°.

DETAILED DESCRIPTION

Disclosed herein is a wafer inverter, which includes a support mechanism that is coupled to a rotary member for inverting a wafer or substrate secured to the wafer support mechanism. In one embodiment, the aforementioned components are housed in a BOLTS compatible housing 12 (FIGS. 1 and 2), though it is to be understood that where so desired, the inverter may be embodied in a custom wafer handling mechanism.

Figure 1:
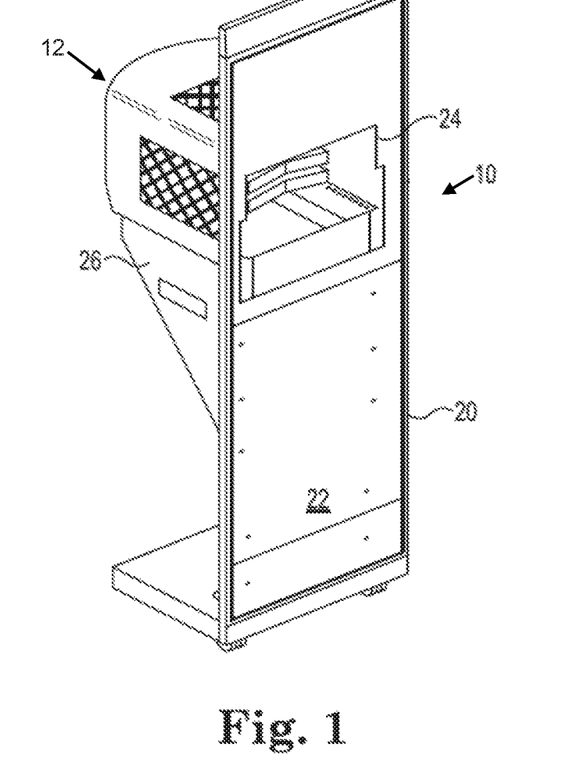
FIG. 1 is an isometric view of a wafer inverter.

In FIG. 1 can be seen one embodiment of a wafer inverter that has been adapted to have substantially the same form factor as a BOLTS compliant front opening unified pod or FOUP. As is well known in the field, BOLTS compliant modules comply with SEMI specified mechanical and control standards to ensure that BOLTS compliant modules will be readily combinable with wafer and substrate handling mechanisms (not shown) that employ the BOLTS standards. An example of such a substrate handling mechanism is the Explorer® Inspection Cluster available from Rudolph Technologies, Inc. of Flanders, N.J. Where desired, a BOLTS compatible module such as the wafer inverter illustrated in FIG. 1 can be added to the substrate handling mechanism of the Explorer® Inspection Cluster without any requirement that the wafer inverter or the substrate handling mechanism be modified. Such compatibility is often referred to in the vernacular as being "plug and play".

The wafer inverter 10 has a chassis 20 that is substantially BOLTS compliant. The chassis 10 has a vertical member 22 with a port 24 formed therethrough. The port 24 allows wafers or substrates (not shown) to be passed to and from a wafer support mechanism. The vertical member 22 of the chassis 20 may be removably coupled to a substrate handling mechanism using any suitable means such as bolts or quick release mechanisms.

Figure 2:
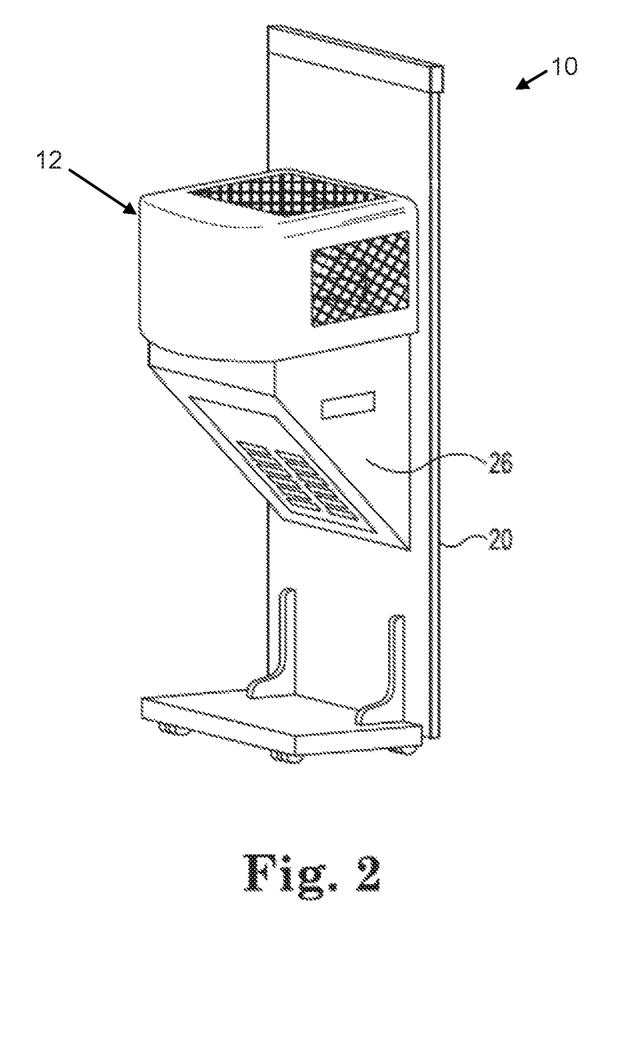
FIG. 2 is an isometric view of the wafer inverter of FIG. 1.

FIG. 2 is another isometric view of the wafer inverter shown in FIG. 1. A horizontal support 26 is coupled to the vertical member 22 of the chassis 20 below the port 24. The support 26, as its name would indicate, supports a wafer inversion mechanism that is coupled thereto. In some embodiments the support 26 will be coupled to the vertical member 22 by means of an elevator or vertical guide that allows the support 26 to be positioned in one or more vertical positions depending on the needs of a user. In one embodiment the support 26 is coupled to a first portion of at least one linear bearing, a second portion of the at least one linear bearing is secured to the vertical member 22. As a result, the support 26 may move relative to the vertical member 22. As will be appreciated, the support 26 will preferably move in a vertical orientation and more preferably in a manner that is perpendicular to a primary plane defined by the planar orientation of wafers or substrates moved by a substrate handling mechanism to which the chassis 20 is secured. Linear encoders and actuators (such as, for example, a ball screw) are provided to control the position of the support 26 in a manner well known to those skilled in the art.

Figure 3:
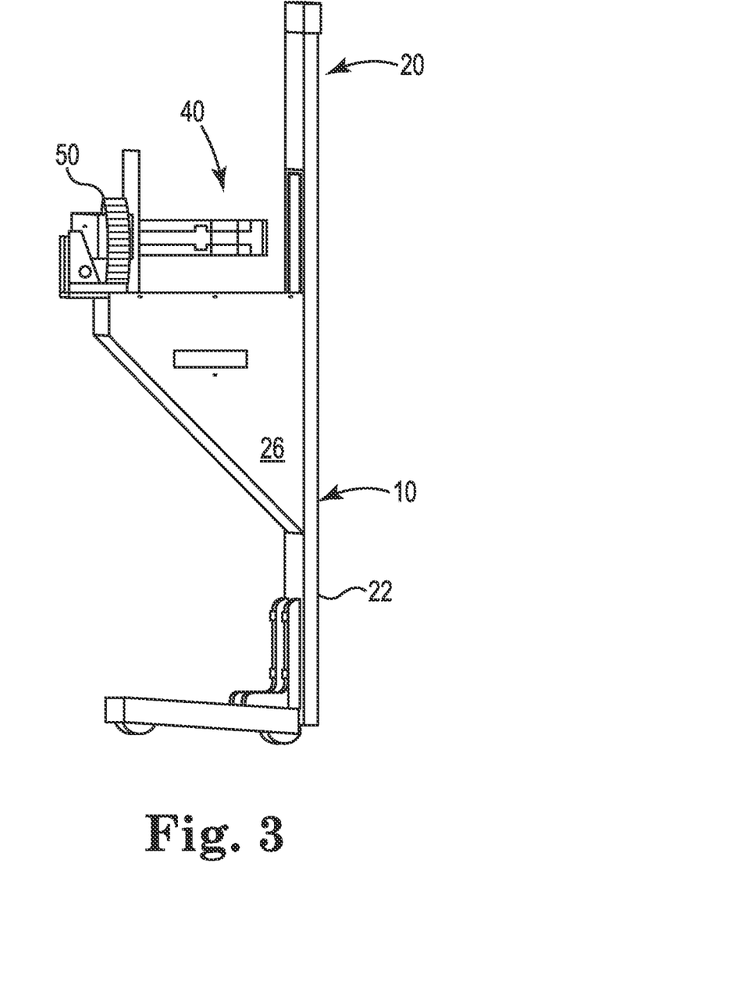
FIG. 3 is a side view of the wafer inverter of FIG. 1 with a cover removed.

FIG. 3 is a side view of one embodiment of a wafer inverter in which a shroud or cover or housing 12 seen in FIGS. 1 and 2 has been removed to make components of the wafer inverter 10 more easily visible. The wafer inverter 10 includes a pair of opposed clamp arms 40 that are in some embodiments fixed in a planar parallel relationship with respect to one another. The clamp arms 40 include one or more gripping members for grasping a wafer. In other embodiments the pair of clamp arms 40 may reciprocate toward and away from one another whilst retaining their planar parallel relationship. In some embodiments the clamp arms 40 have a complex shape and may not define a planar parallel relationship with respect to each other, but in these embodiments, selected portions of each of the clamp arms 40 will define the aforementioned planar parallel relationship. As will be understood, the planar parallel relationship is necessary to address gripping members to a wafer or substrate grasped by the wafer inverter 10. Where a substrate or wafer does not require a planar parallel relationship between the gripping members of the clamp arms 40, the planar parallel relationship will not be required. Similarly, where the gripping members of the clamp arms 40 may be controlled independently so as to address a substrate or wafer at a range of positions, a planar parallel arrangement between the gripping members or the clamp arms 40 may not be required.

Clamp arms 40 are coupled to a rotary member 50 for inverting a substrate or wafer grasped by the gripping members. Preferably the clamp arms 40 rotate symmetrically with respect to the substrate or wafer grasped therebetween so that the substrate or wafer has substantially the same location in its original and inverted positions. However it will be appreciated that the position of an axis of rotation of the clamp arms 40 may be modified so as to accommodate any peculiarities of the substrate or wafer itself or of the wafer handling mechanism to which the wafer inverter 10 is coupled. In one embodiment the rotary member 50 includes a rotary bearing of a suitable type along with an actuator and a rotary encoder for determining a rotational position of the clamp arms 40 and substrate.

Figure 4:
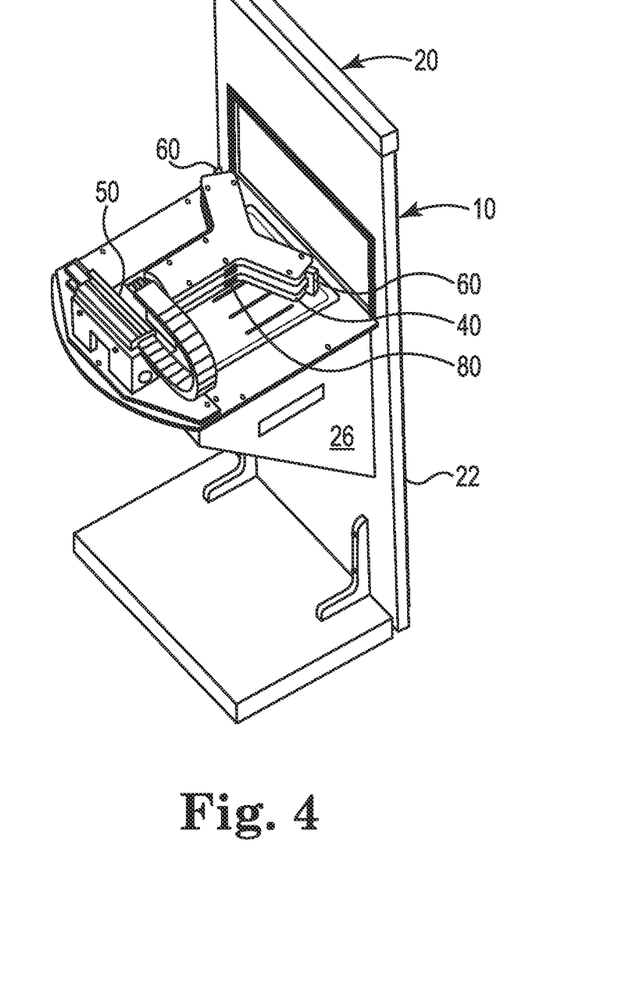
FIG. 4 is an isometric view of the wafer inverter of FIG. 1 with a cover removed.

As seen in FIG. 4, the clamp arms 40 have gripping members 60 positioned at a location adjacent to what would be a peripheral location of a substrate or wafer captured between the clamp arms 40. The gripping members 60 of the lateral distal ends of clamp arms 40 can be seen in FIG. 4. Another gripping member 60 (not shown) is positioned on the clamp arms 40 near to the rotary member 50, again at a position adjacent to what would be a peripheral location of a substrate or wafer captured between the clamp arms 40.

Figure 5:
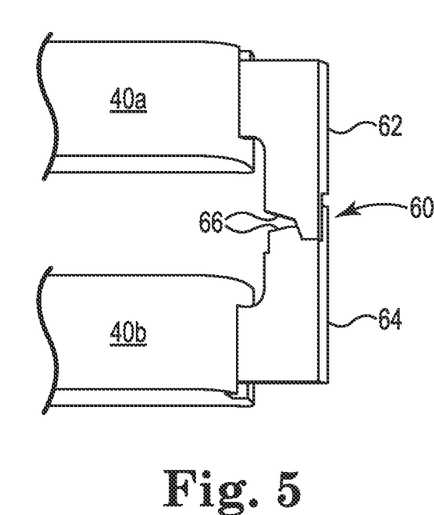
FIG. 5 is a side view of a gripping member.

FIG. 5 is a close up view of a gripping member 60. In the illustrated embodiment, the gripping member 60 is distributed between each of the clamp arms 40, denoted 40a and 40b. In other embodiments, the gripping member 60 may be coupled to a single clamp arm 40. The gripping member 60 has a first portion 62 coupled to clamp arm 40a and a second portion 64 coupled to clamp arm 40b each having a contact face 66. Each of the portions 62, 64 are reciprocal in a plane generally parallel with that of the clamp arms 40, though the requirement is for the reciprocating motion of the portions 62, 64 to move between an inner position which the contact faces 66 of each portion contact and securely grip an edge of a substrate or wafer and an outer position in which a substrate or wafer may be supported between the gripping members 60, but in which the substrate or wafer may be removed and replaced, i.e. a closed position and an open position. Note that the purpose of the clamp arms 40 is to support the gripping members 60. Accordingly the clamp arms 40 may have any shape useful for supporting a desired number of gripping members 60 in any useful arrangement.

Figure 6:
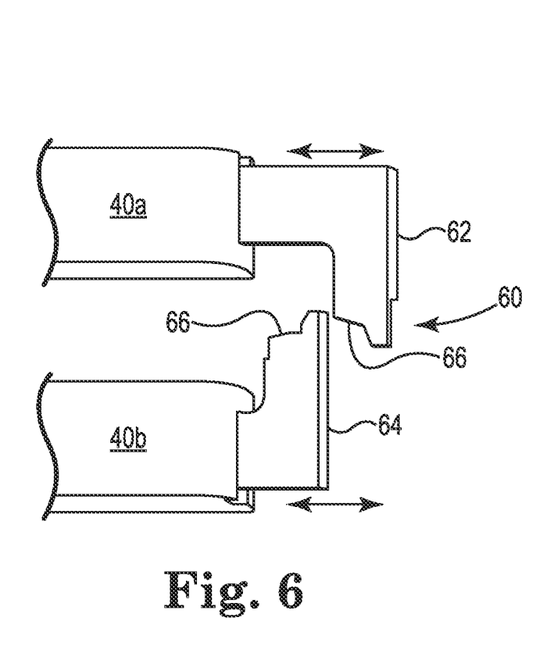
FIG. 6 is a side view of the gripping member of FIG. 5 with portions illustrated in alternative positions.

In FIG. 6 the first portion 62 of gripping member 60 is reciprocated to its outer or open position whereas the second portion 64 of the gripping member 60 is reciprocated to its inner or closed position. In the embodiment of the gripping members 60 illustrated in FIGS. 5 and 6, each of the portions 62, 64 are arranged to overlap one another as they move towards their inner or closed positions. Contact faces 66 are in the illustrated embodiments angled with respect to one another to clamp an edge of a substrate or wafer therebetween as the portions are moved toward their inner, closed position. Clamping of the substrate or wafer between the gripping members 60 is desirable when inverting the substrate or wafer, however this arrangement is not strictly required. What is required, however, is that the wafer or substrate be secured by the gripping members 60 well enough to avoid damage to the wafer or substrate during inversion. Firmly gripping a wafer or substrate has the added advantage in that physical location information of the wafer or substrate may in large part be preserved after the substrate or wafer has been inverted.

Each portion of the gripping members 60 are reciprocated between their inner and outer positions by suitable actuators that may be powered by electrical or pneumatic means.

Figure 7:
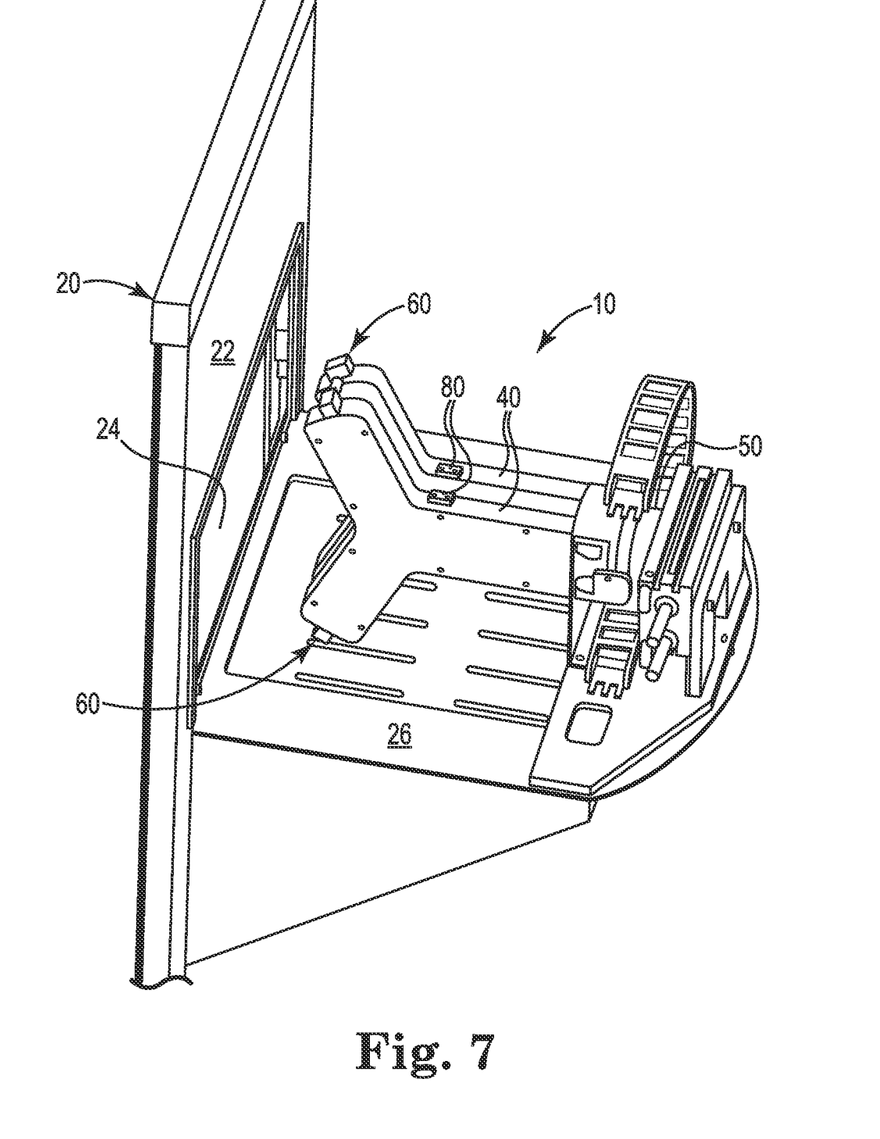
FIG. 7 is a close-up view of the wafer inverter of FIG. 1 rotated to a partially inverted position.

FIG. 7 illustrates the wafer inverter 10 as the rotary member 50 has rotated approximately 90° from a loading position in which the support mechanism is substantially parallel to the support. When the support mechanism is in its essentially 0° position, i.e. when the support mechanism is more or less parallel with the support 26 and the gripping members 60 are in their outer, open position, a wafer or substrate can be placed into or removed from the support mechanism. After a wafer or substrate is placed in the support member 20 between clamp arms 40, the gripping members 60 are actuated to move to their inner, closed position to grip the wafer or substrate. Thereafter, the rotary member 50 is actuated to invert the wafer or substrate. Once inverted, the gripping members 60 are again moved to their open position so that the wafer or substrate can be removed for inspection or processing or, where the wafer or substrate has already been inverted and the most recent inversion has returned the wafer or substrate to its upright position, for return to a cassette for transport or storage. In addition to inversion of wafers and substrates, a wafer or substrate may be stored, at least temporarily in the support mechanism. This may be useful for any number of automation reasons, for example an aligned wafer may be placed in the inverter while a newly inspected or processed wafer is put away in a cassette.

Sensor 80 shown in FIGS. 4 and 7 is an optical sensor that determines whether a wafer or substrate is positioned between the clamp arms 40. Additional sensors may be emplaced upon clamp arms 40 to obtain edge location information about the substrate or wafer to assist in aligning the wafer or substrate. Where the wafer or substrate has a peripheral shape that is well known or understood (e.g. circular), identifying the position of two points on the periphery of the wafer or substrate is sufficient to determine an XY position of the substrate with respect to the clamp arms 40. Additional sensors, (e.g., cameras) may be provided to obtain rotation information to provide angular alignment. In one embodiment, the gripping members may act as sensors useful for determining an XY position of a wafer or substrate. Where the gripping members include one or more members that have a fixed location in an XY plane and at least one other gripping member that will push a wafer or substrate into contact with the fixed gripping member, the act of gripping the wafer or substrate will force the substrate into a known position. In other embodiments, the gripping members may be outfit with a force feedback system in which a desired force is applied to the wafer or substrate during the gripping process. Once the force is applied, the position of each gripper is determined, the position of each gripper providing information concerning the location of the edge of the wafer or substrate to which it is addressed.

In one embodiment, the timing with which a wafer or substrate is released by an end effector of a wafer handling system may affect alignment and/or the retention of alignment information regarding the wafer or substrate. For example, where a wafer or substrate is aligned before it is placed in the wafer inverter, the end effector will retain a grip on the wafer or substrate until after the gripping members have been actuated to their closed positions. In this way the gripping members grasp the wafer or substrate in its aligned state and preserve that aligned state to a substantial degree when the wafer or substrate has been inverted.

In some embodiments it is necessary to avoid touch of an active surface of a wafer or substrate. Accordingly, gripping members that address an edge or the bevels of an edge of a wafer or substrate or often preferred. However it is possible and known to clamp an edge of a wafer or substrate by applying opposing forces to an upper and lower surface of a wafer or substrate, the key being to avoid contacting an active area of the wafer or substrate. When using the inverter with a wafer, clamping forces may be applied in some instances in the edge exclusion zone that is commonly found on wafers. Where this zone is not present, it is best to grasp the wafer by applying clamping forces directed to the bevel region of a wafer edge. In all instances, it is desirable to apply sufficient force to a wafer edge to secure the wafer or substrate in the inverter without deforming or damaging the wafer Thinner wafers may require more directly opposing forces, i.e. clamping forces directed against the upper and lower surfaces of the wafer or substrate in an essentially normal orientation. Thicker wafers or substrates may be grasped with more forces applied in a direction that is along the surface of the wafer or substrate. The orientation of the contact faces on the gripping members and the direction and path of the gripping members is selected, as suggested above, to grip a wafer or substrate in a secure manner without damaging it. The gripping members may be made of any useful material, examples of which may include Vespel, Meldin, Ultem, and PEEK. Generally an edge grip end effector will be used when handling an inverter substrate or wafer to avoid contact with an active area of the wafer or substrate. In other instances, a venturi or Bernouli gripper may be used to handle inverted wafers or substrates.

Although the present invention has been described with reference to preferred embodiments, workers skilled in the art will recognize that changes can be made in form and detail without departing from the spirit and scope of the present invention.

What is claimed is:

1. A BOLTS compatible module comprising:
   a BOLTS compatible housing; and
   a support mechanism including opposing, first and second clamp arms within the housing, the support mechanism to grip a wafer, the support mechanism being coupled to a rotary mechanism including a rotary bearing to rotate the support mechanism with a wafer gripped therein, the rotary mechanism being coupled to the module and capable of at least 180° of rotation to invert a wafer gripped by the support mechanism.

2. The module of claim 1, wherein the clamp arms include at least two gripping members, each gripping member including a pair of contact faces that work in conjunction with one another to grasp the wafer.

3. The module of claim 2, wherein the contact faces are angled with respect to one another.

4. The module of claim 1, further comprising a horizontal support configured to position the support mechanism relative to a vertical member.

5. The module of claim 1, wherein the clamp arms include at least two gripping members carried by arm bodies of the clamp arms, each gripping member having a first portion and a second portion that reciprocate in a plane parallel to that of the clamp arms between an open position in which a wafer may be placed or removed and a closed position in which the first portion overlaps the second portion and the wafer is positively grasped.

6. The module of claim 1, wherein the module is configured such that the rotary mechanism rotates the support mechanism about an axis of rotation parallel with a plane of a wafer gripped by the support mechanism.

7. The module of claim 1, wherein the module is configured such that the rotary mechanism rotates the support mechanism about an axis of rotation that is parallel with a major plane of the first clamp arm and with a major plane of the second clamp arm.

8. The module of claim 1, wherein the first and second clamp arms are fixed in parallel relation to one another.

9. The module of claim 1, wherein the first clamp arm includes a first arm body and a first gripping member portion moveably coupled to the first arm body, and further wherein the second clamp arm includes a second arm body and a second gripping member portion moveably coupled to the second arm body, the first and second gripping member portions combining to define a gripping member configured to selectively grasp a wafer edge, and even further wherein the gripping member portions reciprocate relative to the corresponding arm body in a longitudinal direction of the corresponding arm body.

10. The module of claim 9, wherein the first and second arm bodies are fixed relative to one another in a lateral direction that is perpendicular to the longitudinal direction.

11. The module of claim 10, wherein the first and second arm bodies are Y-shaped.

12. The module of claim 1, wherein the module is configured to be coupled to a wafer and substrate handling mechanism at a BOLTS interface of the wafer and substrate handling mechanism.

13. An edge grip mechanism comprising:
    opposing, spaced apart, first and second arm bodies; and
    at least two gripping members carried by the arm bodies, each gripping member having a first portion carried by the first arm body and a second portion carried by the second arm body, wherein the first portion is movable in a linear path relative to the first arm body and the second portion is moveable in a linear path relative to the second arm body, the portions reciprocating in a plane parallel to the arm bodies between an open position in which a substrate may be placed or removed and a closed position in which the first portion overlaps the corresponding second portion and the substrate is positively grasped;
    each gripping member having a pair of contact faces that work in conjunction with one another to grasp the substrate.

14. The edge grip mechanism of claim 13, wherein the edge grip mechanism is within a BOLTS compatible housing.

15. The edge grip mechanism claim 13, wherein the contact faces are angled with respect to one another.

16. A method of handling a substrate, comprising:
    positioning the substrate between two gripping members, each gripping member having a first portion and a second portion, the first portion moveably supported by a first arm body and the second portion moveably supported by second arm body, the first and second arm bodies arranged in an opposing, spaced apart fashion relative to one another;
    reciprocating the first portion and the second portion of each of the two gripping members in a linear path and in a plane parallel with the arm bodies from an open position in which the substrate was positioned to a closed position in which the first portion and the second portion of each of the two gripping members overlap to positively grasp the substrate; and rotating the substrate 180°.

17. The method of claim 16, wherein positioning the wafer comprises positioning the wafer within a BOLTS compatible housing.

\* \* \* \* \*